(12) United States Patent
Benaissa et al.

(10) Patent No.: US 11,442,571 B2
(45) Date of Patent: Sep. 13, 2022

(54) TOUCH SURFACE DEVICE

(71) Applicant: COMMISSARIAT A L'ENERGIE ATOMIQUE ET AUX ENERGIES ALTERNATIVES, Paris (FR)

(72) Inventors: Lamine Benaissa, Grenoble (FR); Jean-Sebastien Moulet, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/899,762

(22) Filed: Jun. 12, 2020

(65) Prior Publication Data

US 2020/0401262 A1 Dec. 24, 2020

(30) Foreign Application Priority Data

Jun. 24, 2019 (FR) ...................................... 19 06816

(51) Int. Cl.
*G06F 3/043* (2006.01)
*G06F 3/041* (2006.01)

(52) U.S. Cl.
CPC ............ *G06F 3/0416* (2013.01); *G06F 3/043* (2013.01)

(58) Field of Classification Search
CPC .......... G06F 3/041; G06F 3/044; G06F 3/016; G06F 3/0412; G06F 21/62; G06F 21/84;
(Continued)

(56) References Cited

U.S. PATENT DOCUMENTS

| 5,495,137 A | 2/1996 | Park et al. |
| 8,018,010 B2 * | 9/2011 | Tigli .................... G01N 29/326 |
| | | 257/416 |

(Continued)

FOREIGN PATENT DOCUMENTS

| EP | 2 631 959 A2 | 8/2013 |
| WO | WO 2015/055783 A1 | 4/2015 |

(Continued)

OTHER PUBLICATIONS

U.S. Appl. No. 16/221,939, filed Dec. 17, 2018, US 2019-0198397 A1, Francois Andrieu et al.

(Continued)

*Primary Examiner* — Olga V Merkoulova
(74) *Attorney, Agent, or Firm* — Oblon, McClelland, Maier & Neustadt, L.L.P.

(57) ABSTRACT

A touch surface device, comprising at least:
an element comprising a first face forming the touch surface and a second face opposite to the first face;
an acoustic wave sensor including at least one portion of piezoelectric material disposed between two electrodes, the portion of piezoelectric material and both electrodes being structured by forming surface wavinesses as wrinkles, the sensor being secured to the second face of the element such that apexes or valleys of the wrinkles are in contact with the second face of the element;
an electronic circuit coupled to the electrodes of the sensor and configured to identify, from an electric signal intended to be outputted from the electrodes of the sensor, at least one touch gesture made on the touch surface.

13 Claims, 6 Drawing Sheets

(58) Field of Classification Search
CPC . G06F 3/00; G06F 3/011; G06F 3/012; G06F 3/013; G06F 3/014; G06F 3/043
See application file for complete search history.

(56) References Cited

U.S. PATENT DOCUMENTS

| | | | | |
|---|---|---|---|---|
| 8,666,126 | B2* | 3/2014 | Lee | G06K 9/0012 |
| | | | | 382/124 |
| 8,792,169 | B2* | 7/2014 | Jiang | C23C 14/34 |
| | | | | 359/566 |
| 2004/0212869 | A1* | 10/2004 | Srinivasan | G02B 5/1828 |
| | | | | 359/295 |
| 2008/0138013 | A1* | 6/2008 | Parriaux | G02B 5/1814 |
| | | | | 385/37 |
| 2008/0157235 | A1* | 7/2008 | Rogers | H05K 1/0283 |
| | | | | 257/415 |
| 2011/0234545 | A1* | 9/2011 | Tanaka | G06F 3/0436 |
| | | | | 345/177 |
| 2012/0279865 | A1* | 11/2012 | Regniere | C23C 18/54 |
| | | | | 205/125 |
| 2013/0133428 | A1* | 5/2013 | Lee | H01L 41/183 |
| | | | | 73/589 |
| 2013/0214647 | A1 | 8/2013 | Ohnishi et al. | |
| 2014/0176332 | A1* | 6/2014 | Alameh | G06F 21/32 |
| | | | | 340/665 |
| 2014/0219521 | A1* | 8/2014 | Schmitt | G06K 9/00107 |
| | | | | 382/124 |
| 2016/0107194 | A1* | 4/2016 | Panchawagh | G01S 7/5208 |
| | | | | 367/140 |
| 2016/0251250 | A1 | 9/2016 | Benaissa et al. | |
| 2016/0252411 | A1 | 9/2016 | Benaissa et al. | |
| 2016/0257597 | A1 | 9/2016 | Benaissa et al. | |
| 2016/0261248 | A1* | 9/2016 | Grousset | H03H 9/17 |
| 2017/0110504 | A1* | 4/2017 | Panchawagh | B06B 1/0207 |
| 2017/0213807 | A1* | 7/2017 | Benaissa | C23C 14/5806 |
| 2017/0228072 | A1 | 8/2017 | Amin et al. | |
| 2017/0323133 | A1* | 11/2017 | Tsai | B06B 1/0622 |
| 2017/0328866 | A1* | 11/2017 | Apte | B06B 1/0292 |
| 2018/0349663 | A1* | 12/2018 | Garlepp | G06K 9/0002 |
| 2019/0005300 | A1* | 1/2019 | Garlepp | G06K 9/0002 |
| 2021/0218350 | A1* | 7/2021 | West | H01L 41/183 |

FOREIGN PATENT DOCUMENTS

| | | |
|---|---|---|
| WO | WO 2015/055786 A1 | 4/2015 |
| WO | WO 2015/055788 A1 | 4/2015 |
| WO | WO 2016/061155 A1 | 4/2016 |

OTHER PUBLICATIONS

U.S. Appl. No. 16/505,862, filed Jul. 9, 2019, US 2020-0020561 A1, Lamine Benaissa.
U.S. Appl. No. 16/503,662, filed Jul. 5, 2019, US 2020-0020663 A1, Lamine Benaissa et al.
U.S. Appl. No. 16/493,560, filed Sep. 12, 2019, Thu Trang Vo et al.
U.S. Appl. No. 16/774,143, filed Jan. 28, 2020, US 2020-0161336 A1, Yann Lamy et al.
French Preliminary Search Report dated Feb. 12, 2020 in French Application 19 06816 filed Jun. 24, 2019 (with English Translation of Categories of Cited Documents), 3 pages.

* cited by examiner

TOUCH SURFACE DEVICE

TECHNICAL FIELD

The technical field of the invention is that of human-machine interfaces, or HMI, and more generally that of space and/or objects interfacing through touch functions, or tactile functions. The invention is in particular applicable to the making of HMI in the field of domotics or in that of hostile environments, for example in the presence of water, oil, dust, snow, or exposed to high or low temperatures.

STATE OF PRIOR ART

Most robust, affordable and shapeable, that is able to adapt to any shape of a surface to be made tactile, touch solutions, employ capacitive sensors. A capacitive sensor is for example disposed at the surface of the part or object to be functionalised, and is possibly covered with a coating having a small thickness. When the sensor includes an array of capacitive elements, advanced touch functions are possible, such as for example detecting a finger slide or swipe on the touch surface.

The use of capacitive sensors to make a surface tactile has however several drawbacks.

First, the brittleness of the capacitive sensors prevents them from being integrated into the material which makes up the object to be functionalised. Thus, for an optimum integration onto an object, it is necessary to provide a print formed at a surface of the object to accommodate the sensor. Moreover, techniques implemented to secure the sensor to the surface of the object are limited to bonding and cold methods.

When the capacitive sensor is covered with a coating which is thereby used as a touch surface, other requirements have to be met to avoid crosstalk, too low signal/noise ratio, false positives (undesired triggering operations) or even sensor sensitivity loss problems:
  restriction on the nature of the materials that can be used as a coating and which must not interfere with the capacitive detection made by the sensor;
  restriction on the thickness of the coating which has to be less than 2 mm.

If a coating having a thickness higher than 2 mm has to be used, the sensor is then subjected to the following constraints:
  sensor complexification;
  loss of the shapeability for the part to be functionalised;
  widening of the size of the sensor electrodes, resulting in a sensor resolution loss;
  widening of the general sensor design, degrading assessment of advanced touch functions such as a finger slide on the touch surface.

There are piezoelectric sensors which enable a surface to be made tactile even in the presence of a coating having a thickness higher than 2 mm. Touch functions addressable with these sensors are however limited to simple functions such as pressing on the touch surface. Moreover, the use of a non-shapeable piezoelectric element limits its use to planar touch structures.

DISCLOSURE OF THE INVENTION

Thus there is a need to provide a touch, or tactile, surface device not having the drawbacks of solutions of prior art, that is not having the limitations of capacitive sensors, the thickness of the touch surface of which is not limited to 2 mm and which is adaptable to any touch surface shape.

For this, one embodiment proposes a touch surface device, comprising at least:
  an element comprising a first face forming the touch surface and a second face opposite to the first face;
  an acoustic wave sensor including at least one portion of piezoelectric material disposed between two electrodes, the portion of piezoelectric material and both electrodes being structured by forming surface wavinesses, or ripples, as wrinkles, the sensor being secured to the second face of the element such that apexes, or peaks, or valleys of the wrinkles are in contact with the second face of the element;
  an electronic circuit coupled to the electrodes of the sensor and configured to identify, from an electric signal intended to be outputted from the electrodes of the sensor, at least one touch or tactile gesture made on the touch surface.

In this device, detecting a touch gesture by the sensor is made by means of the transmission of acoustic waves in the material of the element, these acoustic waves being detected by the sensor and interpreted by the electronic circuit. This detection type avoids drawbacks encountered when capacitive sensors are used.

The sensor includes surface wavinesses, these wavinesses being commonly referred to the term wrinkles and characterised by an amplitude, a wavelength and an orientation. In comparison with a planar piezoelectric sensor, that is not including wrinkles, the wrinkles provide the sensor with a greater deformability, and thus a greater sensitivity to pressure and thus a greater detection sensitivity. The use of such a sensor including wrinkles enables the element to which the sensor is secured to have a thickness greater than 2 mm without impacting the touch detection made, and enables detection of complex touch gestures such as detecting a finger slide on the touch surface.

Moreover, the wrinkles enable the sensor to detect complex touch functions such as a finger slide on the touch surface or different pressing types (long, short, with several fingers simultaneously, etc.).

Such a device has the advantage of being insensitive to conditions of use (hot, cold, rain, presence of dust and/or oil on the touch surface, use of the device with gloves, etc.) given that the acoustic waves detected are not impacted by these conditions of use. For example, unlike a capacitive sensor which no longer operates as soon as frost appears at the surface of the sensor, when the sensor is exposed to a temperature smaller than 0° C., the device provided remains operational even when exposed to temperatures smaller than 0° C.

This device has also the advantage of offering a greater freedom in the design of the touch surface by means of the absence of print at the surface to accommodate the sensor and the absence of restriction on the nature of the material(s) of the element forming the touch surface (which may be made of metal, plastic, wood, etc.) because the dielectric constant of the element has no influence on the acoustic wave sensor, unlike a capacitive sensor. The element may have a complex geometry comprising for example one or more curvatures, or have any shape (parallelepipedal, pyramidal, etc.).

The term "element" is used to refer to any type of object, structure or part for being touch, or tactile, functionalised by means of the acoustic wave sensor(s).

The electrodes include at least one electrically conducting material, for example at least one metal.

Advantageously, the wrinkles of the sensor may be rectilinear, or straight, and parallel to each other. Such wrinkles are well adapted for detecting a finger slide, on the touch surface, along a direction substantially perpendicular to the orientation of the wrinkles.

Advantageously, the piezoelectric material may correspond to a ceramic material, that is an inorganic material. Such a piezoelectric material has the advantage of properly withstanding high temperatures (that is higher than about 300° C.), unlike polymeric piezoelectric materials. The use of a ceramic piezoelectric material enables in particular the sensor to be integrated in an element made by thermoforming or any other method involving the implementation of steps at significant temperatures.

The sensor may be secured to the second face of the element through at least one bonding layer, or the sensor may be integrated into the element. The advantage of integrating the sensor into the element is in particular that the sensor is thereby not visible from the outside of the element, and the sensor can be protected by the element at all its faces.

The element may form, between the first and second faces and against the sensor, a layer having a thickness higher than 2 mm. Such a significant thickness is possible given the use of the piezoelectric sensor including wrinkles. This significant thickness of the element provides the device with a greater strength and gives a greater protection for the sensor, for example towards vandalism.

The wrinkles may have a period higher than 10 µm. Such a period makes it possible to have a sensor well adapted to the detection of acoustic waves generated by gestures made against the touch surface of the device.

The device may include several acoustic wave sensors secured to the second face of the element. With several acoustic wave sensors coupled to the second face of the element, it is possible to detect complex touch gestures or to obtain further information, as for example the direction of a finger slide on the touch surface of the element.

According to a first embodiment, when the device includes several sensors, the portion of piezoelectric material of each sensor may be distinct, namely separated or spaced, from the portions of piezoelectric material of the other sensors, and the electrodes of each sensor may be distinct from the electrodes of the other sensors.

According to a second embodiment, when the device includes several sensors, the portions of piezoelectric material of all the sensors may be formed by a single continuous piezoelectric layer common to all the sensors, and at least one of the electrodes of each sensor may be distinct from the electrodes of the other sensors.

The electronic circuit may be configured to identify a finger slide on the touch surface according to a direction substantially perpendicular to the direction along which the wrinkles extend.

The sensor may have a thickness smaller than 100 µm. Such a sensor can be fitted to thin elements.

It is also proposed a method for making a touch surface device, comprising the following steps:

providing at least one acoustic wave sensor including at least one portion of piezoelectric material disposed between two electrodes, the portion of piezoelectric material and both electrodes being structured by forming surface wavinesses as wrinkles;

providing at least one element comprising a first face intended to form the touch surface and a second face opposite to the first face;

securing the sensor to the second face of the element such that apexes, or peaks, or valleys of the wrinkles are in contact with the second face of the element;

coupling the electrodes of the sensor to an electronic circuit configured to identify, from an electric signal intended to be outputted from the electrodes of the sensor, at least one touch gesture made on the touch surface.

According to a first embodiment, securing the sensor to the second face of the element may include bonding the sensor against the second face of the element.

According to a second embodiment, providing the element and securing the sensor to the second face of the element may include:

positioning the sensor on a support;

thermoforming or injection moulding of the element, during which the sensor is positioned against the second face, and at the end of which the sensor is integrated into the element.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different figures described hereinafter bear the same reference numerals so as to facilitate switching from one figure to the other.

The different parts shown in the figures are not necessary drawn to a uniform scale, to make the figures more legible.

The different possibilities (alternatives and embodiments) should be understood as being non-exclusive of each other and can be combined with each other.

DETAILED DISCLOSURE OF PARTICULAR EMBODIMENTS

Figure 1:
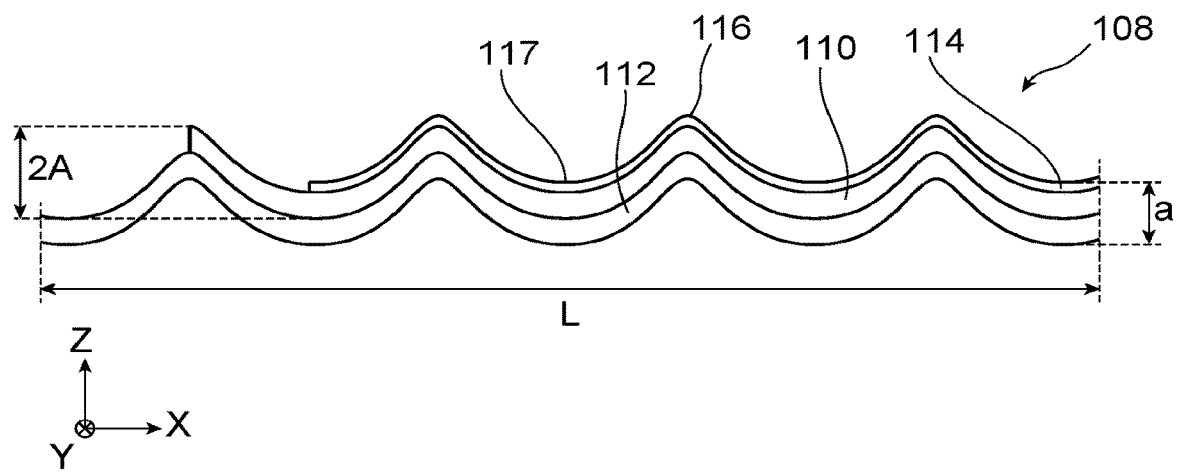
FIGS. 1 and 2 respectively show a cross-section view and a top view of the sensor of the touch surface device according to the first embodiment.
Figure 2:
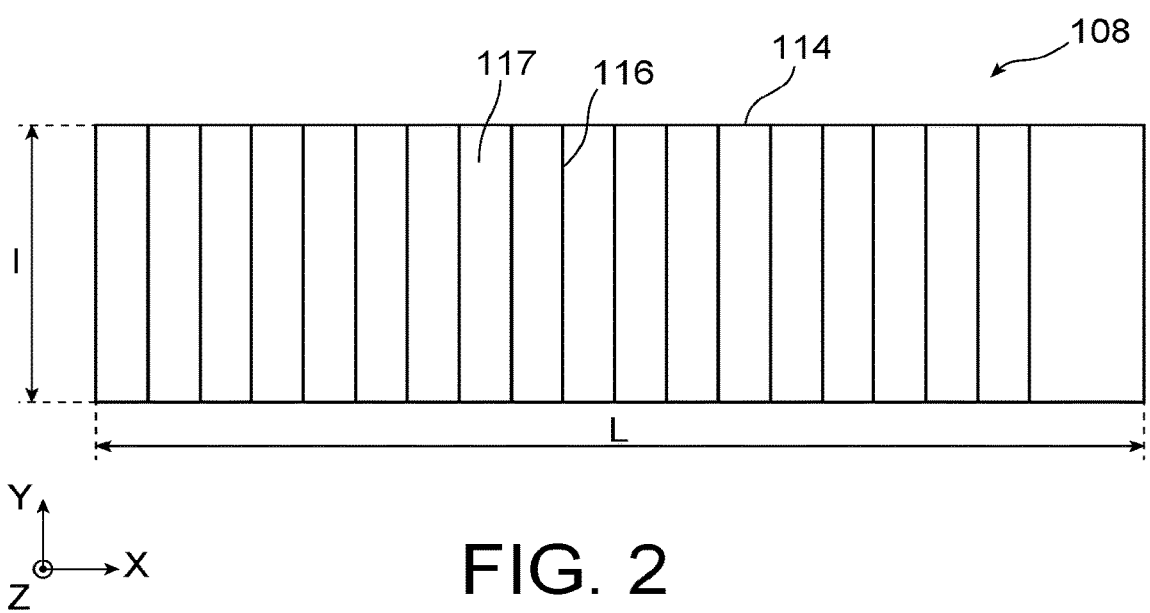
Figure 3:
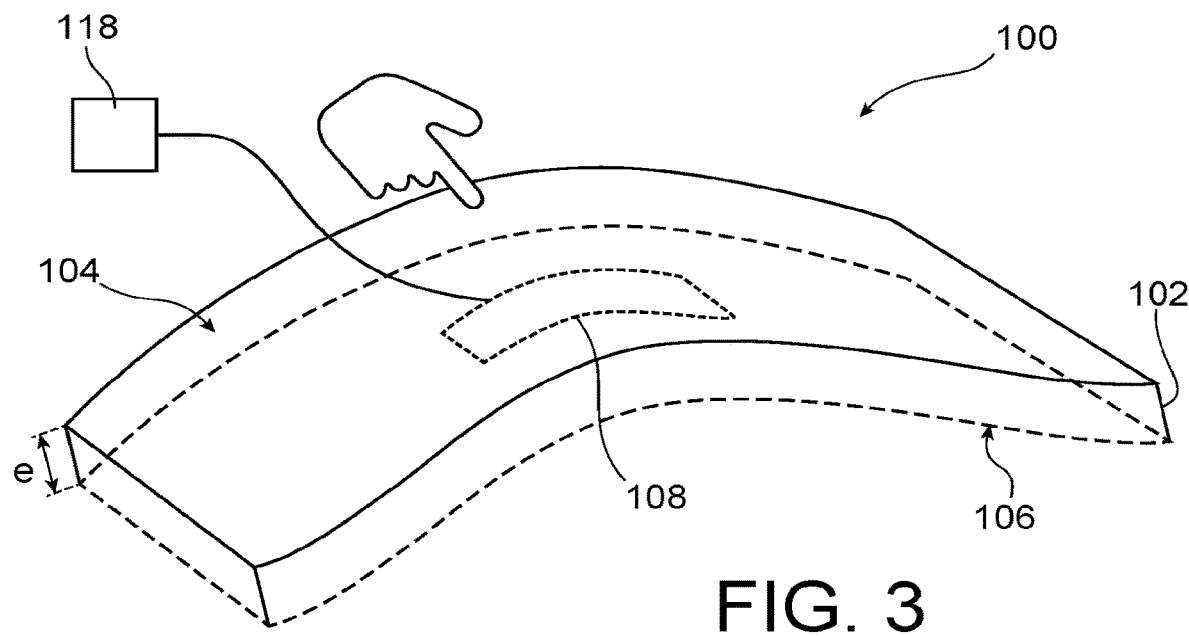
FIG. 3 shows a touch surface device according to a first embodiment.

A touch surface device 100 according to a first embodiment is described hereinafter in connection with FIGS. 1 to 3. FIG. 1 corresponds to a cross-section view of an acoustic wave sensor 108 of the device 100. FIG. 2 corresponds to a top view of the sensor 108. FIG. 3 corresponds to a perspective view of the device 100.

The device 100 includes an element 102 comprising a first face 104. The first face 104 forms a touch surface, or tactile surface, of the device 100, that is the surface on which touch gestures (pressing, slide, etc.) are to be made by a user of the device 100. The element 102 also includes a second face 106 opposite to the first face 104. The element 102 may be of any shape. In the example shown in FIG. 3, the element 102 is curved.

In the first embodiment, the distance between faces 104, 106, here corresponding to the thickness e of the layer formed by the element 102, is higher than 2 mm.

The device 100 includes the acoustic wave sensor 108. The sensor 108 includes a portion 110 of piezoelectric material disposed between two electrodes 112, 114 ensuring collection of charges generated by piezoelectric effect upon deforming the piezoelectric material of the portion 110.

Advantageously, the piezoelectric material of the portion 110 corresponds to a ceramic material, namely an inorganic material, as for example AlN, PZT, ZnO, $LiNbO_3$, $LiTaO_3$, $KNbO_3$, quartz, $SrTiO_3$, BaTiO3 or langasite. Alternatively, if the piezoelectric material is not exposed to significant temperatures upon making the device 100, the piezoelectric material may be a polymer, as for example P(VDF-TrFE).

Electrodes 112, 114 each includes for example a metal material such as aluminium, tungsten, titanium, copper, nickel, platinum, palladium, gold, silver, or an alloy of several of these metals. Possibly, one or each of the electrodes 112, 114 may be a metal multilayer element which comprises one or more diffusion barriers including for example TiN and/or TaN and/or WN. One or each of the electrodes 112, 114 may also include at least one transparent conducting oxide corresponding for example to one of the following materials: indium tin oxide (ITO), fluorine-doped tin oxide (FTO), doped zinc oxide, a conducting polymer such as poly (3,4-ethylenedioxythiophene) or PEDT, poly (3,4-ethylenedioxythiophene):poly(styrene sulfonate) or PEDOT:PSS, poly(4,4-dioctylcyclopentadithiophene). One or each of the electrodes 112, 114 may correspond to a 2D material-based layer such as graphene or including carbon nanotubes (CNT).

The length L of the sensor 108 is for example between 1 mm and the length of the second face 106 of the element 102. The width I of the sensor 108 is for example between 0.5 mm and the width of the second face 106 of the element 102. The thickness of the portion of piezoelectric material 110 is for example between 500 nm and 20 µm. The electrode 112 (corresponding to the electrode disposed on the side opposite to the second face 106) may have a thickness between about 2 µm and 100 µm. The surface area of the electrode 112 may be equal to that of the portion of piezoelectric material 110, or higher than that of the portion of piezoelectric material 110 (part of the electrode 112 which may be directly in contact with element 102). The electrode 114 (corresponding to the electrode disposed on the side of the second face 106, against the element 102) may have a thickness between about 3 nm and 2 µm. The surface area of the electrode 114 may be between about 50 µm×50 µm and the surface area of the portion of piezoelectric material 110. The thickness (noted "a" in FIG. 1) of the sensor 108 (which corresponds to the sum of the thicknesses of the portion 110 and the electrodes 112 and 114) is preferably smaller than 100 µm. By way of example, the sensor 108 may have the following characteristics:
  length L=10 mm;
  width I=3 mm;
  thickness of the portion 110=1 µm;
  thickness of the electrode 112 (that disposed on the side opposite to the face 106)=4 µm;
  thickness of the electrode 114 (that disposed on the side of the face 106, against the element 102)=50 nm.

Whatever the shape of the element 102, the sensor 108 is disposed against the face opposite to the touch surface of the element 102.

The piezoelectric layer 110 and electrodes 112, 114 are structured by forming surface wavinesses as wrinkles. In the exemplary embodiment described herein, the wrinkles are rectilinear and parallel to each other (and parallel to the axis Y shown in FIG. 1). The wrinkles are made with an amplitude A, for example equal to 10 µm, and a period λ. Advantageously, the period λ is higher than 10 µm, and for example equal to 50 µm. The value of the period λ is proportional to that of the amplitude A. The amplitude A corresponds to half the peak-to-peak height 2A of a same layer of the sensor 108. The apexes, or peaks, of the wrinkles have reference 116 and the valleys of wrinkles have reference 117. The period λ corresponds to the distance between two adjacent apexes, or peaks, 116.

Examples of method implemented to form the sensor 108, and more particularly wrinkles 116, are for example described in documents WO 2015/055788 A1, WO 2015/055783 A1 and WO 2015/055786 A1, and are applicable to make the sensor 108 described herein.

The sensor 108 is secured to the second face 106 of the element 102 such that the apexes; or peaks, 116 of the wrinkles are in contact with the second face 106. In the first embodiment described here, the sensor 108 is secured to the second face 106 through bonding, that is through a bonding layer (not visible in FIGS. 1 to 3) interposed between the sensor 108 and the second face 106. Other bonding types may be implemented for securing the sensor 108 against the second face 106 of the element 102.

Figure 4:
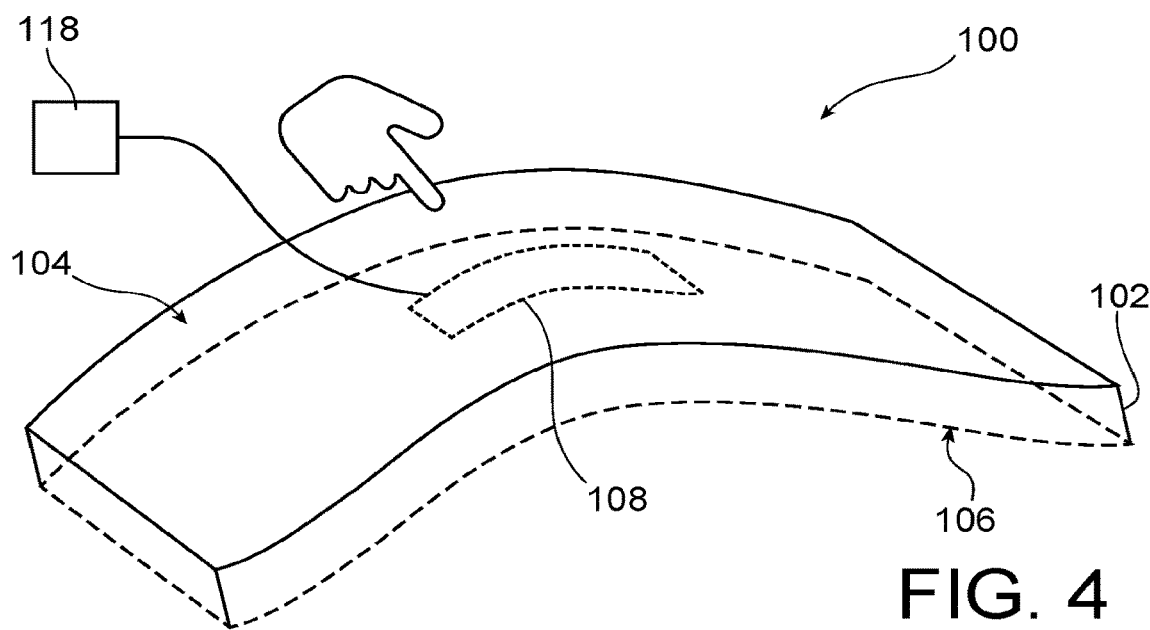
FIGS. 4 and 5 show a touch surface device according to a second embodiment.
Figure 5:
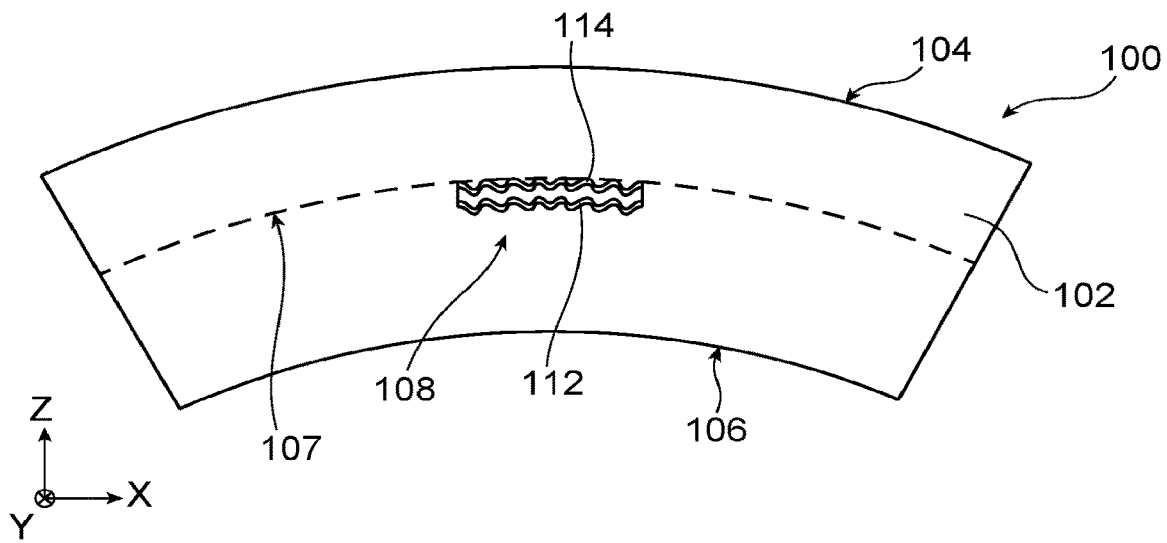

According to a second embodiment, the sensor 108 is integrated into the element 102 and at least partially surrounded by the element 102. In this second embodiment, the element 102 is for example made by thermoforming. The sensor 108 is in this case disposed into the element 102, that is fully surrounded by the material of the element 102. The face of the element 102 against which the sensor 108 is disposed does not correspond to the second face 106 forming an external face of the element 102 but corresponds to a face referenced 107 formed within, that is inside, the portion of the material of the element 102 and against which the electrode 114 is disposed. FIGS. 4 and 5 schematically show the device 100 according to this second embodiment.

According to a third embodiment, the sensor 108 may be integrated against or into an intermediate element analogously to the previously described integration according to one of the two previous embodiments. This intermediate element may then be assembled to the element 102 by any mechanical attachment means (like screws, rivets, attachment clips etc.). In this case, the sensor 108 is actually coupled to the element 102 such that apexes, or peaks, or valleys of the wrinkles are in contact, via the intermediate element, with the second face of the element 102.

In the three previously described embodiments, the device 100 also includes an electronic circuit 118 connected to the electrodes 112, 114 of the sensor 108. The circuit 118 is configured to identify, from electric signals outputted by the sensor 108 from the electrodes 112, 114, one or more touch gestures made on the touch surface of the element 102, that is on the first face 104. Advantageously, the electronic circuit 118 may be configured to identify a finger slide on the first face 104 along a direction substantially perpendicular to the direction along which the wrinkles 116 extend. In the second embodiment, electric connections connecting the electrodes 112, 114 to the electronic circuit 118 pass through the element 102.

In addition to the finger slide movement on the first face 104, the device 100 according to both previously described embodiments enables other touch gestures made on the first face 104 to be identified, as for example a movement of (long or short) pressing and releasing one or more fingers on the first face 104, a contact movement, a vibration movement, etc.

Figure 6:
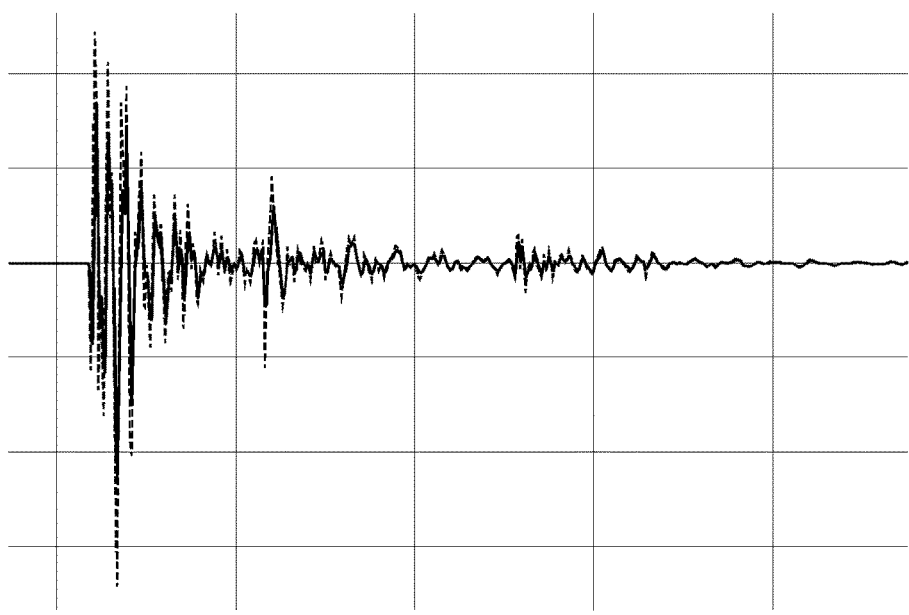
FIGS. 6 to 9 show examples of electric signals obtained during touch gestures made on the touch surface of a device.

FIG. 6 shows an example of electric signal obtained between electrodes 112, 114 of the sensor 108 during a vibration on the touch surface 104 of the device 100.

Figure 7:
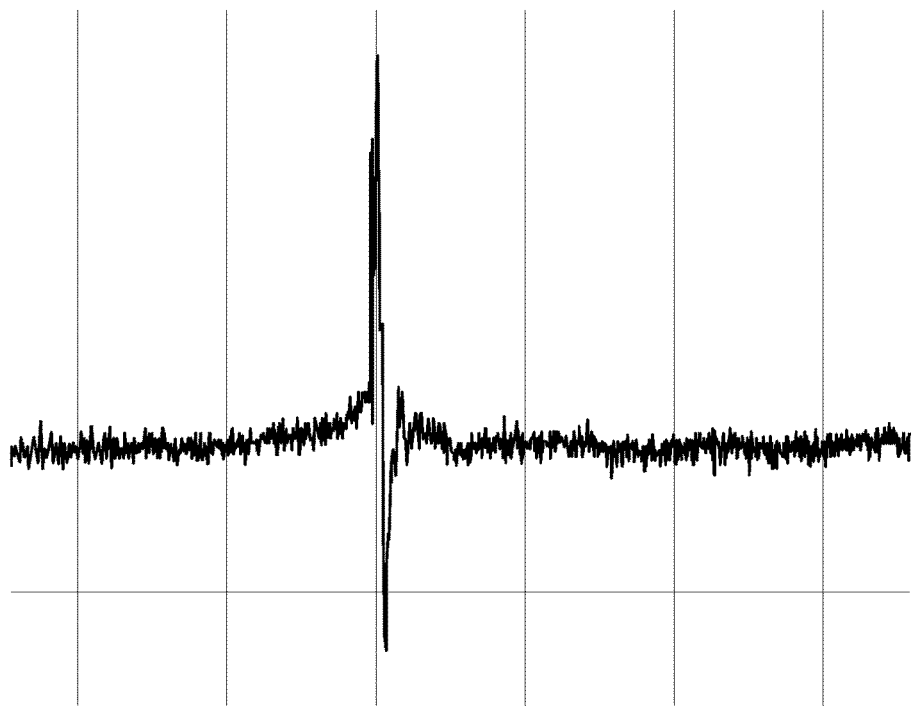

FIG. 7 shows an example of electric signal obtained between electrodes 112, 114 of the sensor 108 during a short press of a finger on the touch surface 104 of the device 100.

Figure 8:
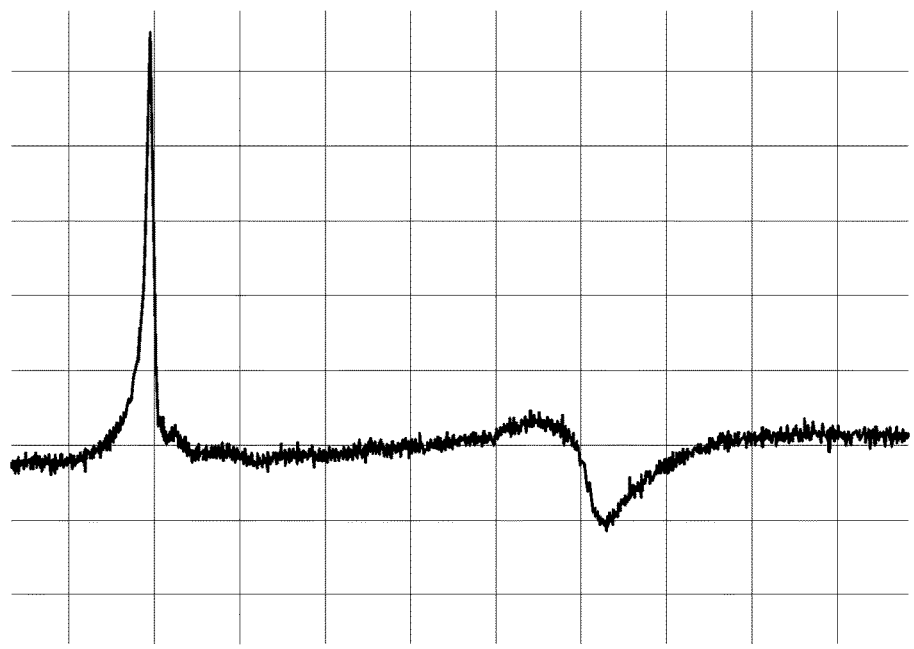

FIG. 8 shows an example of electric signal obtained between electrodes 112, 114 of the sensor 108 during a long press of a finger on the touch surface 104 of the device 100.

Figure 9:
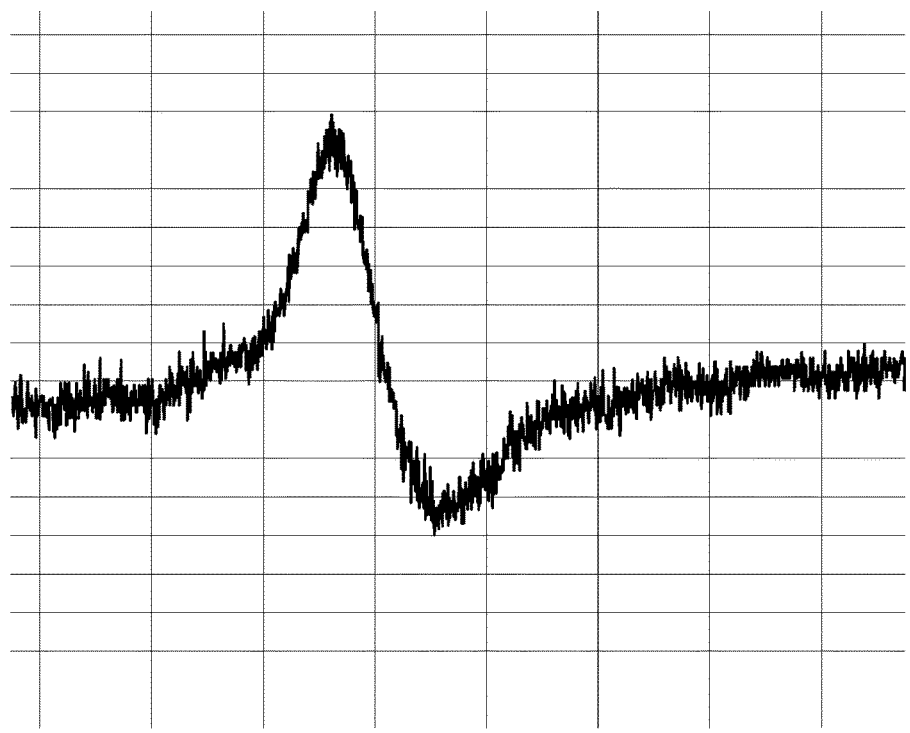

FIG. 9 shows an example of electric signal obtained between electrodes 112, 114 of the sensor 108 during a finger slide on the touch surface 104 of the device 100.

All these signals show different characteristics (different spaces between peaks, repetitions of peaks, etc.) which are used by the electronic circuit 118, via implementing a processing of these signals, to identify the type of touch gesture made on the touch surface of the device 100. Details for this processing are not described here but this processing can be readily implemented by those skilled in the art, for example via a digital and/or computer processing of the electric signals outputted by the electrodes of the sensor(s) of the device 100.

For making the device 100 according to the first embodiment, the sensor 108 and the element 102 are first made independently of each other, and then the sensor 108 is disposed on a temporary substrate and bonded against the second face 106 of the element 102 using for example a bonding layer. The temporary substrate may then be removed. Electrodes 112, 114 of the sensor 108 are then coupled to the electronic circuit 118.

For making the device 100 according to the second embodiment, the sensor 108 is first made, and then the element 102 is then made by integrating the sensor 108 into the element 102. For this, the sensor 108 may be positioned on a support, and then the element 102 may be made by thermoforming around the sensor 108. Openings may be made in the element 102 to access the electrodes 112, 114. Then, the electrodes 112, 114 of the sensor 108 are coupled to the electronic circuit 118.

In addition to thermoforming, the element 102 may be made by other techniques depending on the nature of the materials used and the geometrical characteristics of the element 102, as for example: moulding, freeze casting, impregnation or infiltration, pyrolysis, strip casting, injection or extrusion moulding, blowing or foaming process, assembling, ink jet, aerosol spraying, deposition, etc.

In both previously described embodiments, the device 100 includes a single sensor 108 disposed against a second face 106 or 107 of the element 102. Alternatively, the device 100 may include several sensors 108 in contact with the second face 106 or 107.

Figure 10:
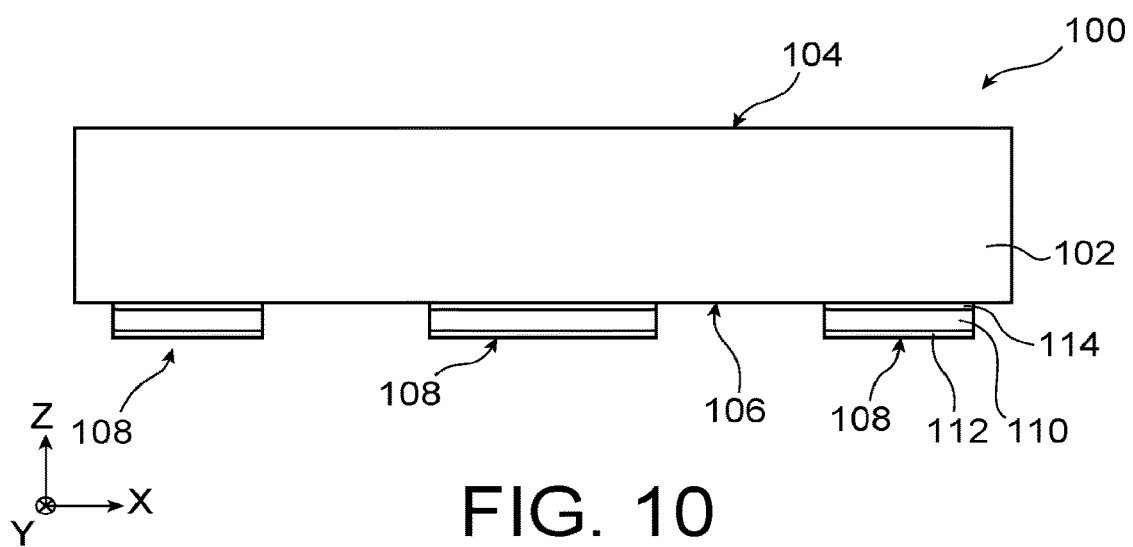
FIGS. 10 and 11 show a touch surface device according to alternative embodiments.

FIG. 10 schematically shows a first exemplary embodiment of a device 100 including several sensors 108 disposed next to each other against the second face 106 of a same element 102. The sensors 108 are used to functionalise together the first face 104 of the element 102. In this first exemplary embodiment, the sensors 108 include portions of piezoelectric material 110 and electrodes 112, 114 which are distinct from one sensor to the other. In other words, the portion 110 of piezoelectric material of each of the sensors 108 is spaced and separated from the portions 110 of piezoelectric material of the other sensors 108. Likewise, the electrodes 112, 114 of each of the sensors 108 are spaced and separated from the electrodes 112, 114 of the other sensors 108.

Figure 11:
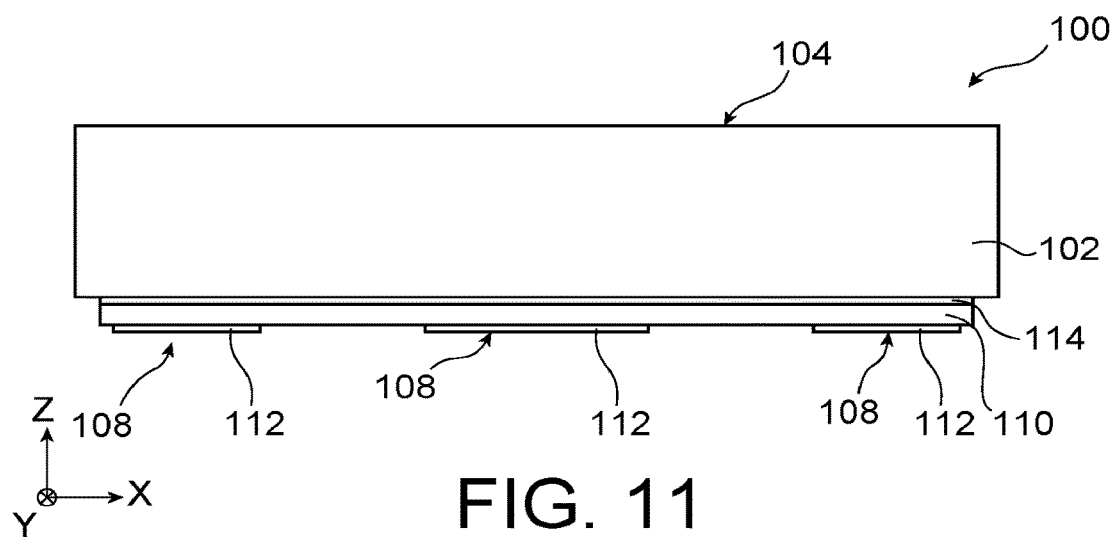

FIG. 11 schematically shows a second exemplary embodiment of a device 100 including several sensors 108 disposed next to each other against the second face 106 of a same element 102. As in the first exemplary embodiment, the sensors 108 are used together to functionalise the first face 104 of the element 102. In this second exemplary embodiment, the portions 110 of piezoelectric material of the sensors 108 are formed by a single continuous piezoelectric layer common to all the sensors 108. Moreover, at least one of the electrodes 112, 114 of each sensor 108 is distinct from the electrodes of the other sensors 108, that is separated and spaced from the electrodes of the other sensors 108. In the example shown in FIG. 11, the electrode 114 of each of the sensors 108 is formed by a same layer of continuous electrically conducting material and common to all the sensors 108 (forming an electrode common to all the sensors 108), and the electrode 112 of each sensor 108 is formed by a portion of electrically conducting material distinct and spaced from the portions of electrically conducting material forming the electrodes 112 of the other sensors 108.

Whatever of the exemplary embodiment of the device 100, the use of several sensors 108 associated with a same surface enables more complex touch gestures to be identified, as for example detecting several simultaneous distinct pressing actions on the touch surface or detecting the finger slide direction on the touch surface and the speed thereof.

When the device 100 includes several sensors 108, wrinkles of these sensors may be oriented along a same direction or along different directions. For example, the device 100 may include two sensors 108 secured to the second face 106 and positioned such that wrinkles of both sensors 108 are oriented perpendicular to each other. In this case, the device 100 is well adapted to distinguish slide movements on the touch surface of the device 100 along two directions perpendicular to each other, for example a slide along a top-bottom direction and a slide along a left-right direction. Other combinations of sensors 108 on the second face 106 of the device 100 may be contemplated.

Figure 12:
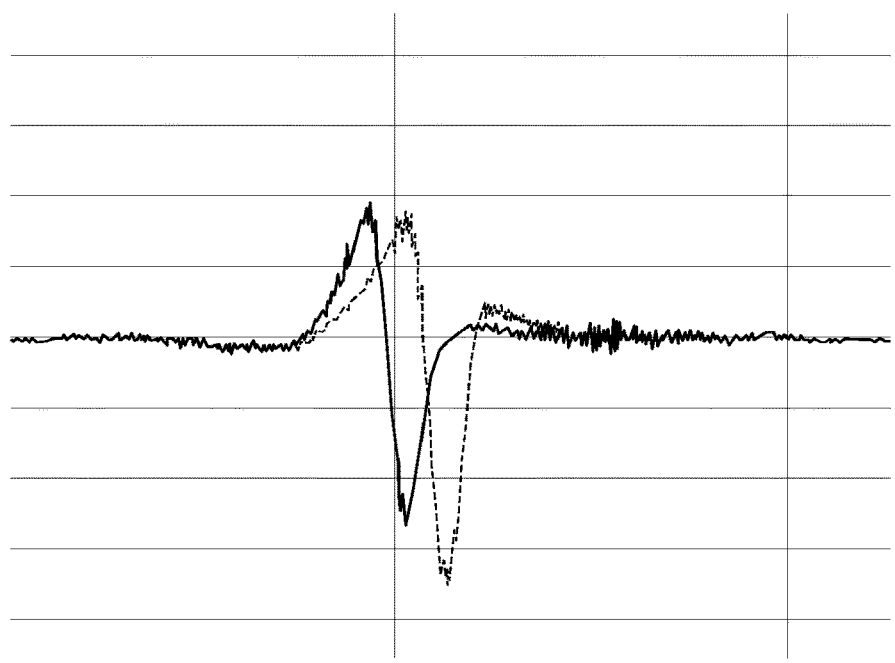
FIG. 12 shows examples of electric signals obtained during touch gestures made on the touch surface of a device.

FIG. 12 shows an example of electric signals obtained across two sensors 108 of a device 100 during a finger slide on the touch surface of this device 100. The presence of both sensors 108 enables the finger slide direction to be identified on the touch surface of the device 100 according to the time offset between both signals.

The device 100 may include one or more other parts or elements to which the element 102 may be assembled. The sensor 108 may in particular be interposed between the element 102 and one or more other elements of the device 100.

The presence of several sensors 108 on a same surface of a device 100 is also possible when the device 100 corresponds to the previously described second embodiment, that is by integrating the sensors 108 into the element 102 of the device 100.

Whatever the exemplary embodiment, the device allows functionalisation of a surface of an object, a structure or a part with touch functions. Being thus provided with these touch functions, the surface becomes sensitive to touch loads and may, directly or indirectly, trigger a response to these loads. This response may include a haptic (for example tactile and/or visual and/or audio and/or mechanical) feedback and/or triggering one or more actions, for example mechanical such as opening/closing a system, and/or electric such as switching on, switching off or a light variation of a lighting system.

The invention claimed is:

1. A touch surface device, comprising:
   an element comprising a first face forming the touch surface and a second face opposite to the first face;
   an acoustic wave sensor including at least one portion of piezoelectric material disposed between two electrodes, the portion of piezoelectric material and both electrodes having a wave shape including a plurality of wrinkles even when the sensor is not moving, the sensor being secured to the second face of the element such that apexes or valleys of the wrinkles are in contact with the second face of the element; and
   an electronic circuit coupled to the electrodes of the sensor and configured to identify, from an electric signal outputted from the electrodes of the sensor, at least one touch gesture made on the touch surface.

2. The device according to claim 1, wherein the wrinkles of the sensor are rectilinear and parallel to each other.

3. The device according to claim 1, wherein the piezoelectric material corresponds to a ceramic material.

4. The device according to claim 1, wherein the sensor is secured to the second face of the element through at least one bonding layer, or wherein the sensor is integrated into the element.

5. The device according to claim 1, wherein the element forms, between the first and second faces and against the sensor, a layer with a thickness higher than 2 mm.

6. The device according to claim 1, wherein the wrinkles have a period higher than 10 μm.

7. The device according to claim 1, including several acoustic wave sensors secured to the second face of the element.

8. The device according to claim 7, wherein the portion of piezoelectric material of each sensor is distinct from the portions of piezoelectric material of the other sensors, and wherein the electrodes of each sensor are distinct from the electrodes of the other sensors.

9. The device according to claim 7, wherein the portions of piezoelectric material of all the sensors are formed by a single continuous piezoelectric layer common to all the sensors, and wherein at least one of the electrodes of each sensor is distinct from the electrodes of the other sensors.

10. The device according to claim 1, wherein the sensor has a thickness smaller than 100 μm.

11. A method for making a touch surface device, comprising:
    providing at least one acoustic wave sensor including at least one portion of piezoelectric material disposed between two electrodes, the portion of piezoelectric material and both electrodes having a wave shape including a plurality of wrinkles even when the sensor is not moving;
    providing at least one element comprising a first face for forming the touch surface and a second face opposite to the first face;
    securing the sensor to the second face of the element such that apexes or valleys of the wrinkles are in contact with the second face of the element; and
    coupling the electrodes of the sensor to an electronic circuit configured to identify, from an electric signal outputted from the electrodes of the sensor, at least one touch gesture made on the touch surface.

12. The method according to claim 11, wherein securing the sensor to the second face of the element includes bonding the sensor against the second face of the element.

13. The method according to claim 11, wherein providing the element and securing the sensor to the second face of the element includes:
    positioning the sensor on a support;
    thermoforming or injection moulding the element, during which the sensor is positioned against the second face, and at the end of which the sensor is integrated into the element.

* * * * *